United States Patent
Kim et al.

(10) Patent No.: US 9,905,791 B2
(45) Date of Patent: Feb. 27, 2018

(54) ORGANIC LIGHT-EMITTING DEVICE HAVING ELECTRON TRANSPORT REGION INCLUDING LANTHANIDE AND ALKALI METAL HALIDE

(71) Applicant: SAMSUNG DISPLAY CO., LTD., Yongin-si, Gyeonggi-do (KR)

(72) Inventors: Eungdo Kim, Yongin-si (KR); Dongchan Kim, Yongin-si (KR); Wonjong Kim, Yongin-si (KR); Dongkyu Seo, Yongin-si (KR); Dahea Im, Yongin-si (KR); Sanghoon Yim, Yongin-si (KR); Wonsuk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 58 days.

(21) Appl. No.: 14/831,824

(22) Filed: Aug. 20, 2015

(65) Prior Publication Data
US 2016/0248034 A1  Aug. 25, 2016

(30) Foreign Application Priority Data
Feb. 24, 2015 (KR) ........................ 10-2015-0025922

(51) Int. Cl.
*H01L 29/08* (2006.01)
*H01L 51/50* (2006.01)
(Continued)

(52) U.S. Cl.
CPC ...... *H01L 51/5072* (2013.01); *H01L 51/5084* (2013.01); *H01L 51/5092* (2013.01);
(Continued)

(58) Field of Classification Search
CPC ............. H01L 51/5072; H01L 51/5084; H01L 51/5092; H01L 51/5221; H01L 51/5231
See application file for complete search history.

(56) References Cited

U.S. PATENT DOCUMENTS

| 6,525,465 B1 * | 2/2003 | Fujita | H01L 51/5092 313/504 |
| 2008/0024059 A1 * | 1/2008 | Hsu | H01L 51/5092 313/506 |

(Continued)

FOREIGN PATENT DOCUMENTS

| JP | 2000-268968 A | 9/2000 |
| JP | 2007-123124 A | 5/2007 |

(Continued)

*Primary Examiner* — Matthew Gordon
(74) *Attorney, Agent, or Firm* — Lewis Roca Rothgerber Christie LLP (57) ABSTRACT

An organic light-emitting device includes a substrate, an anode on the substrate, a hole transport region on the anode, an emission layer on the hole transport region, an electron transport region on the emission layer, and a cathode on the electron transport region, wherein the electron transport region includes an electron injection layer including a first material including at least one of a halide of an alkali metal, and a second material including at least one of a lanthanide metal and a alkaline earth metal, and wherein the cathode contacts the electron injection layer and includes a first metal including at least one of silver, gold, platinum, copper, manganese, titanium, cobalt, nickel, and tungsten, and a second metal including at least one of a lanthanide metal and an alkaline earth metal, wherein an amount of the first metal is equal to or greater than that of the second metal.

18 Claims, 5 Drawing Sheets

(51) Int. Cl.
*H01L 51/52* (2006.01)
*H01L 51/00* (2006.01)

(52) U.S. Cl.
CPC ...... *H01L 51/5221* (2013.01); *H01L 51/5231* (2013.01); *H01L 51/0081* (2013.01); *H01L 2251/301* (2013.01); *H01L 2251/558* (2013.01)

(56) References Cited

U.S. PATENT DOCUMENTS

| | | | |
|---|---|---|---|
| 2008/0157663 A1* | 7/2008 | Sung | H01L 51/5234 313/504 |
| 2009/0096357 A1 | 4/2009 | Lee et al. | |
| 2016/0111676 A1* | 4/2016 | Ishidai | C09K 11/06 257/40 |
| 2016/0141541 A1* | 5/2016 | Noda | H01L 51/5008 257/40 |

FOREIGN PATENT DOCUMENTS

| | | |
|---|---|---|
| KR | 10-0864882 B1 | 10/2008 |
| KR | 10-0879477 B1 | 1/2009 |

\* cited by examiner

| | |
|---|---|
| CATHODE | —150 |
| ELECTRON INJECTION LAYER (2) | —242b |
| ELECTRON INJECTION LAYER (1) | —242a |
| ELECTRON TRANSPORT LAYER | —141 |
| EMISSION LAYER | —130 |
| HOLE TRANSPORT LAYER | —122 |
| HOLE INJECTION LAYER | —121 |
| ANODE | —110 |
| SUBSTRATE | —101 |

ORGANIC LIGHT-EMITTING DEVICE HAVING ELECTRON TRANSPORT REGION INCLUDING LANTHANIDE AND ALKALI METAL HALIDE

CROSS-REFERENCE TO RELATED APPLICATION

This application claims priority to and the benefit of Korean Patent Application No. 10-2015-0025922, filed on Feb. 24, 2015, in the Korean Intellectual Property Office, the disclosure of which is incorporated herein in its entirety by reference.

BACKGROUND

1. Field

Aspects of one or more exemplary embodiments relate to an organic light-emitting device.

2. Description of the Related Art

Organic light-emitting devices are self-emission devices using materials that emit light when a voltage is applied thereto. Organic light-emitting devices have high brightness and excellent contrast ratios, wide viewing angles, high response speed, and low driving voltage characteristics, and produce multicolored images.

As an example, an organic light-emitting device has a structure in which an organic emission layer is disposed between an anode and a cathode. When a voltage is applied thereto, holes provided from the anode and electrons provided from the cathode are injected into the organic emission layer. Electron exchange between these holes and electrons occurs in adjacent molecules of the organic emission layer, and accordingly, the holes and electrons move toward opposite electrodes from each other. The holes and electrons are recombined in a molecule to produce excitons having a high-energy excited state. These excitons change from a high-energy excited state to a low-energy ground state, thereby generating material-specific light. To increase emission efficiency, an organic light-emitting device includes, in addition to an emission layer, an electron injection layer, an electron transport layer, a hole transport layer, a hole transport layer, and/or the like.

Efforts have been made to improve the efficiency and lifespan of an organic light-emitting device.

SUMMARY

Aspects of one or more exemplary embodiments are directed to an organic light-emitting device capable of decreasing driving voltage and increasing light-emitting efficiency.

Additional aspects will be set forth in part in the description which follows and, in part, will be apparent from the description, or may be learned by practice of the presented embodiments.

According to one or more exemplary embodiments, there is provided an organic light-emitting device including: a substrate; an anode on the substrate; a hole transport region on the anode; an emission layer on the hole transport region; an electron transport region on the emission layer; and a cathode on the electron transport region, wherein the electron transport region includes an electron injection layer including: a first material including at least one of a halide of an alkali metal (Group 1); and a second material including at least one of a lanthanide metal and a alkaline earth metal (Group 2), and wherein the cathode contacts the electron injection layer and includes a first metal including at least one of silver (Ag), gold (Au), platinum (Pt), copper (Cu), manganese (Mn), titanium (Ti), cobalt (Co), nickel (Ni), and tungsten (W); and a second metal including at least one of a lanthanide metal and an alkaline earth metal, wherein an amount of the first metal is equal to or greater than that of the second metal.

In an embodiment, the first material includes at least one of lithium chloride (LiCl), sodium chloride (NaCl), potassium chloride (KCl), rubidium chloride (RbCl), cesium chloride (CsCl), potassium bromide (KBr), rubidium bromide (RbBr), cesium bromide (CsBr), potassium iodide (KI), rubidium iodide (RbI), and cesium iodide (CsI).

In an embodiment, the lanthanide metal or the alkaline earth metal includes at least one of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), beryllium (Be), magnesium (Mg), calcium (Ca), strontium (Sr), barium (Ba), and radium (Ra).

In an embodiment, a thickness of the electron injection layer is in a range of 1 Å to 50 Å.

In an embodiment, the first material and the second material are co-deposited to form the electron injection layer.

In an embodiment, a volume ratio of the first material to the second material is in a range of 1:9 to 9:1.

In an embodiment, the first material includes at least one of RbI and RbCl; and the second material includes at least one of Yb and Mg.

In an embodiment, the electron injection layer includes a first layer formed of the first material, and a second layer formed of the second material.

In an embodiment, the electron injection layer includes a first layer formed of the second material, and a second layer formed of the first material.

In an embodiment, the first material includes at least one of RbI and RbCl, and the second includes at least one of Yb and Mg.

In an embodiment, each of thicknesses of the first layer and the second layer is in a range of 1 Å to 49 Å, and a sum of the thicknesses is in a range of 1 Å to 50 Å.

In an embodiment, a volume ratio of the first metal to the second metal is in a range of 50:50 to 99:1.

In an embodiment, the cathode is formed of Ag:Mg or Ag:Yb.

In an embodiment, the electron transport region further includes an electron transport layer between the electron injection layer and the emission layer.

In an embodiment, the electron transport layer includes at least one of Alq$_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate (Bebq$_2$), and 9,10-di(naphthalene-2-yl)anthrascene (ADN).

In an embodiment, the electron transport layer further includes a lithium (Li) complex.

In an embodiment, the electron transport region further includes a hole blocking layer between the electron transport layer and the emission layer.

In an embodiment, the hole transport region includes at least one of a hole injection layer, a hole transport layer, and an electron blocking layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Figure 1:
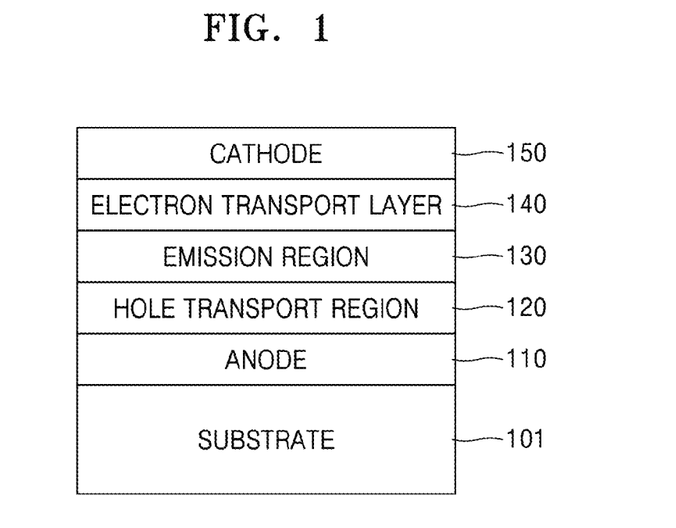
FIG. 1 is a schematic cross-sectional view of an organic light-emitting device according to an embodiment of the present invention.

FIG. 1 is a schematic cross-sectional view of an organic light-emitting device 100 according to an embodiment of the present invention. The organic light-emitting device 100 has a substrate 101 and an anode 110, a hole transport region 120, an emission region 130, an electron transport region 140, and a cathode 150 that are sequentially stacked in the stated order. Hereinafter, each region of the organic light-emitting device 100 will be further described mainly in terms of a function thereof.

Holes provided from the anode 110 are injected into the emission region 130 via the hole transport region 120, and electrons provided from the cathode 150 are injected into the emission region 139 via the electron transport region 140. Afterwards, such holes and electrons are recombined in the emission region 130, thereby producing excitons.

Each of the hole transport region 120, the emission region 130, and the electron transport region 140 may have a single-layer structure or a multi-layer structure including two or more layers.

The hole transport region 120 may include at least one selected from a hole injection layer, a hole transport layer, an electron blocking layer, and a hole transport region auxiliary layer. The term "hole injection layer" used herein refers to a functional layer that facilitates hole injection from the anode to an organic layer, and the term "hole transport layer" used herein refers to a functional layer that facilitates hole transport from the cathode to an emission layer. The term "electron blocking layer" used herein refers to a functional layer that prevents or substantially prevents electrons from flowing to the anode via the emission region, and the term "hole transport region auxiliary layer" used herein refers to various layers performing various functions between the anode and an emission layer. The hole transport region auxiliary layer may be, for example, a layer for securing a resonance distance.

The electron transport region 140 may include at least one selected from an electron injection layer, an electron transport layer, a hole blocking layer, and an electron transport region auxiliary layer. The term "electron injection layer" used herein refers to a functional layer that facilitates electron injection from the cathode to an organic layer, and the term "electron transport layer" used herein refers to a functional layer that facilitates electron transport from the anode to an emission layer. The term "hole blocking layer" used herein refers to a functional layer that prevents or substantially prevents holes from flowing to the cathode via the emission region, and the term "electron transport region auxiliary layer" used herein refers to various layers performing various functions between the emission layer and the cathode.

The electron transport region 140 may include an electron injection layer including a first material and a second material, wherein the first material may be selected from a halide of an alkali metal (Group 1) and the second material may be selected from a lanthanide metal and an alkaline earth metal (Group 2).

The halide of the alkali metal and the lanthanide metal or the alkaline earth metal may become transparent upon a reaction. The alkali metal may produce ions having a low work function, and the ions are considered to improve the electron injection efficiency. However, the mechanism of the electron injection efficiency is not limited thereto.

The cathode 150 may contact the electron injection layer, and may include at least one first metal selected from silver (Ag), gold (Au), platinum (Pt), copper (Cu), manganese (Mn), titanium (Ti), cobalt (Co), nickel (Ni), and tungsten (W), and at least one second metal selected from a lanthanide metal and an alkaline earth metal.

A combination of the materials for forming the electron injection layer and the cathode 150 may provide the organic light-emitting device 100, according to an embodiment, improved electron injection efficiency and excellent low driving voltage, transparency, and efficiency characteristics.

Figure 2:
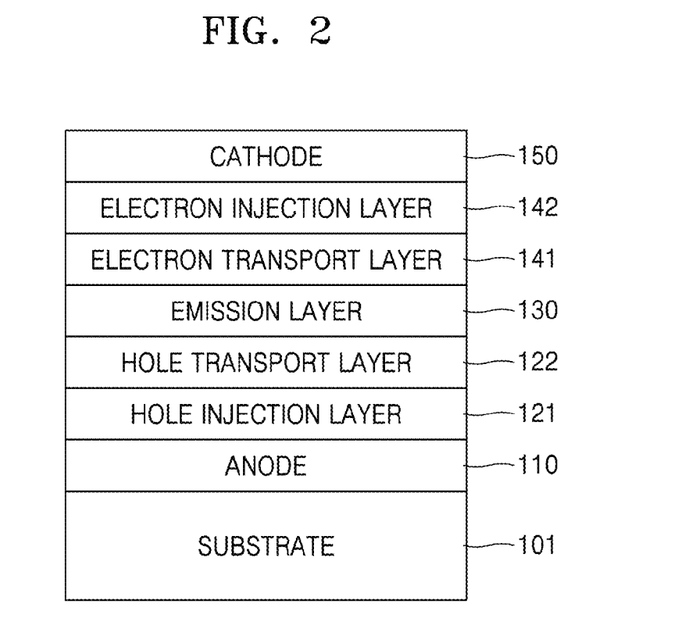
FIG. 2 is a schematic cross-sectional view of an organic light-emitting device according to another embodiment of the present invention.

FIG. 2 is a schematic cross-sectional view of an organic light-emitting device 200 according to another embodiment of the present invention.

The organic light-emitting device 200 has the substrate 101, the anode 110, a hole injection layer 121, hole transport layer 122, an emission layer 130, an electron transport layer 141, an electron injection layer 142, and the cathode 150. Hereinafter, each layer of the organic light-emitting device 200 will be further described in detail.

Any substrate that is in general organic light-emitting devices may be used as the substrate 101. The substrate 101 may be a glass substrate or a transparent plastic substrate with excellent mechanical strength, thermal stability, transparency, surface smoothness, ease of handling, and water repellency. The substrate 101 may be formed of oblique materials, such as silicon or stainless steel.

The anode 110 is disposed on the substrate 101, and may be formed of a material having a relatively high work function. The anode may be formed of transparent conductive oxide, such as indium tin oxide (ITO), indium zinc oxide (IZO), zinc oxide (ZnO), aluminum-doped zinc oxide (AZO), indium oxide ($In_2O_3$), and/or tin oxide ($SnO_2$), but is not limited thereto. The anode 110 may be formed on the substrate 101 according to a deposition method or a sputtering method.

The hole injection layer 121 may be disposed on the anode 110. The hole injection layer 121 may be formed of, for example, a phthalocyanine compound, such as copper phthalocyanine, a diamine or triamine compound, such as N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-tris(N,N-diphenylamino)triphenylamine (TDATA), and 4,4', 4"-tris{N,-(2-naphthyl)-N-phenylamino}-triphenylamine (2T-NATA), and/or a polymer compound, such as poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), and polyaniline/poly(4-styrenesulfonate) (PANI/PSS), but is not limited thereto.

The hole injection layer 121 may be formed on the anode 110 by using various suitable methods, such as vacuum deposition, spin coating, casting, and a Langmuir-Blodgett (LB) deposition method.

When the hole injection layer 121 is formed on the anode 110 by vacuum deposition, deposition conditions may vary according to a compound used to form the hole injection layer 121 and characteristics of the hole injection layer 121, and for example, the deposition conditions include a deposition temperature in a range of about 100° C. to about 500° C., a vacuum pressure in a range of about $10^{-8}$ torr to about $10^{-3}$ torr, and a deposition rate in a range of about 0.01 Å/sec to about 100 Å/sec.

When the hole injection layer 121 is formed on the anode 110 by spin coating, coating conditions may vary according to a compound used to form the hole injection layer 121 and characteristics of the hole injection layer 121, and for example, the coating conditions include a coating speed in a range of about 2,000 rpm to about 5,000 rpm, and a temperature at which a heat treatment is performed after coating to remove a solvent may be in a range of about 80° C. to about 200° C.

A thickness of the hole injection layer 121 may be in a range of about 100 Å to about 10,000 Å (e.g., about 100 Å to about 1,000 Å). When the thickness of the hole injection layer 121 is within these ranges, satisfactory hole injecting characteristics may be obtained without a substantial increase in driving voltage.

The hole transport layer 122 may be disposed on the hole injection layer 121. The hole transport layer 122 may be, for example, a carbazole derivative, such as N-phenylcarbazole and polyvinylcarbazole, a triphenylamine-based compound, such as N,N'-bis(3-methylphenyl)-N,N'-diphenyl-[1,1-biphenyl]-4,4'-diamine (TPD) and 4,4',4"-tris(N-carbazolyl) triphenylamine (TCTA), and/or N,N'-di(1-naphthyl)-N,N'-diphenylbenzidine (NPB), but is not limited thereto.

The hole transport layer 122 may be formed on the hole injection layer 121 by using various suitable methods, such as vacuum deposition, spin coating, casting, and LB deposition method. When the hole transport layer 122 is formed by vacuum deposition and spin coating, deposition and coating conditions may vary according to a compound used to form the hole transport layer 122, but may be determined by referring to the deposition and coating conditions for forming the hole injection layer 121.

A thickness of the hole transport layer 122 may be in a range of about 50 Å to about 1,000 Å, e.g., about 100 Å to about 800 Å. When the thickness of the hole transport layer 122 is within these ranges, satisfactory hole transporting characteristics may be obtained without a substantial increase in driving voltage.

At least one of the hole injection layer 121 and the hole transport layer 122 may further include, in addition to the hole injection materials and the hole transport materials known in the art, a charge-generation material for the improvement of conductive characteristics of a layer.

The charge-generation material may be, for example, a p-dopant. Non-limiting examples thereof are a quinone derivative such as tetracyanoquinonedimethane (TCNQ) or 2,3,5,6-tetrafluoro-tetracyano-1,4-benzoquinonedimethane (F4-TCNQ); and a metal oxide such as a tungsten oxide or a molybdenum oxide, but are not limited thereto.

When the hole injection layer 121 and the hole transport layer 122 further include the charge-generation material, the charge-generation material may be homogeneously or non-homogeneously dispersed on the hole injection layer 121 and the hole transport layer 122.

The emission layer (EML) 130 may be disposed on the hole transport layer 122 by using various suitable methods, such as vacuum deposition, spin coating, casting, and a LB method. When the EML 130 is formed by vacuum deposition and spin coating, deposition and coating conditions may vary according to a compound used to form the EML 130, but may be determined by referring to the deposition and coating conditions for forming the hole injection layer 121.

A material used to form the EML 130 may include at least one of the materials known in the art (including both a host and a dopant).

The host may be, for example, tris(8-quinolinato)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di(naphth-2-yl) anthracene (TBADN), distyrylarylene (DSA), (tris(N-carbazolyl)benzene (TCP), E3, and/or 4,4'-bis(9-carbazolyl)-2,2'-dimethyl-biphenyl (CDBP), but is not limited thereto.

The dopant may be a dopant that is already known in the art. The dopant known in the art may be at least one of a fluorescent dopant and a phosphorescent dopant. The phosphorescent dopant may include an organic metal complex including Ir, Pt, Os, Re, Ti, Zr, Hf, or combinations of two or more thereof, but is not limited thereto.

A red dopant may be, for example, PtOEP(Pt(II) octaethylporphine, Pt(II), tris(2-phenylisoquinoline)iridium (Ir(piq)$_3$), and/or bis(2-(2'-benzothienyl)-pyridinato-N,C3') iridium(acetylacetonate) (Btp$_2$Ir(acac)), but is not limited thereto.

A green dopant may be, for example, tris(2-phenylpyridine) iridium (Ir(ppy)$_3$), bis(2-phenylpyridine)(acetylacetonato)iridium(III) (Ir(ppy)$_2$(acac), tris(2-(4-tolyl)phenylpyridine)iridium (Ir(mppy)$_3$), and/or 10-(2-benzothiazolyl)-1,1, 7,7-tetramethyl-2,3,6,7-tetrahydro-1H,5H,11H-[1] benzopyrano[6,7,8-ij]-quinolizin-11-one (C545T), but is not limited thereto.

A blue dopant may be, for example, bis[3,5-difluoro-2-(2-pyridyl)phenyl](picolinato)iridium(III) (F$_2$Irpic), (F$_2$ppy)$_2$Ir(tmd), Ir(dfppz)$_3$, 4,4'-bis(2,2'-diphenylethen-1-yl) biphenyl (DPVBi), 4,4'-bis[4-(diphenylamino)styryl]biphenyl (DPAVBi), and/or 2,5,8,11-tetra-tert-butyl perylene (TBPe), but is not limited thereto.

When the EML 130 includes a host and a dopant, an amount of the dopant may be in a range of about 0.01 to about 15 parts by weight, based on 100 parts by weight of the host, but is not limited thereto.

A thickness of the EML 130 may be in a range of about 100 Å to about 1,000 Å, e.g., about 200 Å to about 600 Å. When thickness of the EML 130 is within these ranges, excellent emission characteristics may be obtained without a substantial increase in driving voltage.

The electron transport layer 141 may be formed on the EML 130. The electron transport layer 141 may be formed of, for example, Alq$_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq$_2$), and/or 9,10-di(naphthalene-2-yl)anthrascene (ADN), but is not limited thereto.

The electron transport layer 141 may be disposed on the EML 130 by using various suitable methods, such as vacuum deposition, spin coating, casting, and LB deposition method. When the electron transport layer 141 is formed by vacuum deposition and spin coating, deposition and coating conditions may vary according to a compound used to form the electron transport layer 141, but may be determined by referring to the deposition and coating conditions for forming the hole injection layer 121.

A thickness of the electron transport layer 141 may be in a range of about 100 Å to about 1,000 Å, e.g., about 150 Å to about 500 Å. When the thickness of the electron transport layer 141 is within these ranges, satisfactory electron transporting characteristics may be obtained without a substantial increase in driving voltage.

Alternatively, the electron transport layer 141 may include an electron-transporting organic compound and a metal-containing material. The metal-containing material may include a lithium (Li) complex. The Li complex may include, for example, lithium quinolate (LiQ) or lithium [2-(2-hydroxyphenyl)benzothiazole] (LiBTz).

The electron injection layer 142 may be formed on the electron transport layer 141. The electron injection layer 142 may include a first material selected from a halide of an alkali metal (Group 1), and a second material selected from a lanthanide metal and an alkaline earth metal (Group 2).

The halide of the alkali metal (Group 1) may include, for example, lithium chloride (LiCl), sodium chloride (NaCl), potassium chloride (KCl), rubidium chloride (RbCl), cesium chloride (CsCl), potassium bromide (KBr), rubidium bromide (RbBr), cesium bromide (CsBr), potassium iodide (KI), rubidium iodide (RbI), and/or cesium iodide (CsI).

The lanthanide metal or the alkaline earth metal may include, for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), beryllium (Be), magnesium (Mg), calcium (Ca), strontium (Sr), barium (Ba), and/or radium (Ra).

The electron injection layer 142 may be formed on the electron transport layer 141 by using a co-deposition method associated with the halide of the alkali metal and a metal material of the lanthanide metal or the alkaline earth metal. Here, a (volume) ratio of the halide of the alkali metal to the metal material may be in a range of about 1:9 to about 9:1 (e.g., about 4:6 to about 6:4). For example, the electron injection layer 142 may be disposed on the electron transport layer 141 by using a co-deposition method associated with a halonide, such as RbI or RbCl, and a metal of Yb or Mg.

A thickness of the electron injection layer 142 may be in a range of about 1 Å to about 50 Å (e.g., about 10 Å to about 30 Å). When the thickness of the electron injection layer 142 is within these ranges, satisfactory electron injecting characteristics may be obtained without a substantial increase in driving voltage.

The cathode 150 may be disposed on the electron injection layer 142.

The cathode 150 contacts the electron injection layer 142, and may include a first metal that is at least one selected from silver (Ag), gold (Au), platinum (Pt), copper (Cu), manganese (Mn), titanium (Ti), cobalt (Co), nickel (Ni), and tungsten (W); and a second metal that is selected from a lanthanide metal and an alkaline earth metal.

An amount of the first metal may be equal to or greater than that of the second metal in the cathode 150. For example, a volume ratio of the first metal to the second metal may be in a range of about 50:50 to about 99:1.

The cathode 150 may be formed on the electron injection layer 142 by using, for example, a co-deposition method associated with the first metal and the second metal. A thickness of the cathode 150 may be in a range of about 10 Å to about 300 Å (e.g., about 50 Å to about 150 Å). The cathode 150 may be formed by, for example, Ag and Mg (Ag:Mg) co-deposition or Ag and Yb (Ag:Yb) co-deposition.

Figure 3:
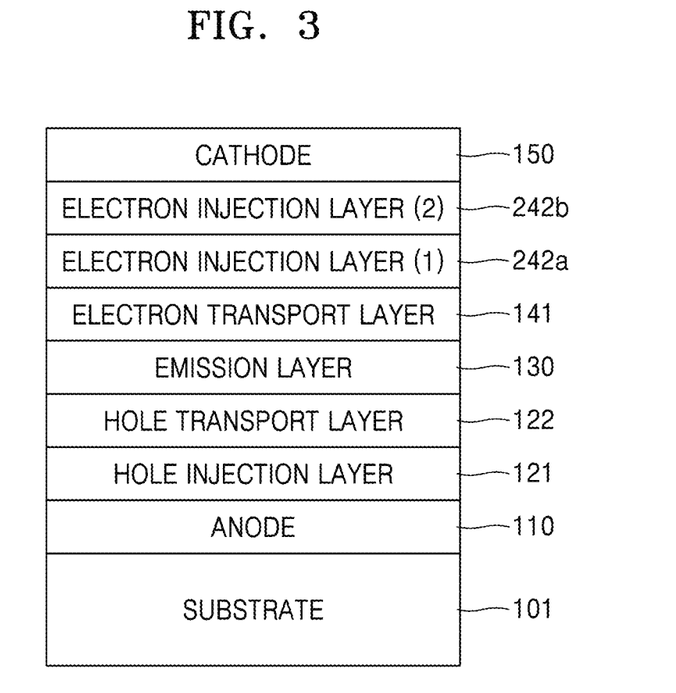
FIG. 3 is a schematic cross-sectional view of an organic light-emitting device according to another embodiment of the present invention.

FIG. 3 a schematic cross-sectional view of an organic light-emitting device 300 according to another embodiment of the present invention.

The organic light-emitting device 300 includes the same or substantially the same configuration of layers as those of the organic light-emitting device 100, except that an electron injection layer 242 has a two-layered structure including a first electron injection layer 242a and a second electron injection layer 242b.

The first electron injection layer 242A may include a halide of an alkali metal. The halide of the alkali metal may include, for example, LiCl, NaCl, KCl, RbCl, CsCl, KBr, RbBr, CsBr, KI, RbI, and/or CsI.

The second electron injection layer 242B may include a lanthanide metal or an alkaline earth metal.

The lanthanide metal or the alkaline earth metal may include, for example, La, Ce, Pr, Nd, Pm, Sm, Eu, Gd, Tb, Dy, Ho, Er, Tm, Yb, Lu, Be, Mg, Ca, Sr, Ba, and/or Ra.

The positions on which the first electron injection layer 242A and the second electron injection layer 242B are disposed may be changed to each other. That is, the first electron injection layer 242A may contact the electron transport layer 141, and the second electron injection layer 242B may contact the cathode 150. Alternatively, the second electron injection layer 242B may contact the electron transport layer 141, and the first electron injection layer 242A may contact the cathode 150.

A total thickness of the first electron injection layer 242A and the second electron injection layer 242B may be in a range of about 1 Å to about 50 Å (e.g., about 10 Å to about 30 Å). Here, the thicknesses of the first electron injection layer 242A and the second electron injection layer 242B may be each in a range of about 1 Å to about 49 Å (e.g., about 5 Å to about 20 Å).

Organic light-emitting devices according to exemplary embodiments may further include, as desired, at least one of a hole blocking layer, an electron blocking layer, a hole transport region auxiliary layer, and an electron transport region auxiliary layer as described in connection with the organic light-emitting device 100 of FIG. 1.

The exemplary embodiments above may be applied to various suitable structures of organic light-emitting devices that emit a single color, multiple colors, or a white color. In addition, these exemplary embodiments may be applied to both a top-emission display device or a bottom-emission display device.

Transparency Test

Test Example 1

$Alq_3$ (300 Å) and Yb (100 Å) were co-deposited on a glass substrate, so as to form a laminated film.

Test Example 2

$Alq_3$ (300 Å), RbI (30 Å), and Yb (100 Å) were deposited on a glass substrate, so as to form a laminated film.

Figure 4A:
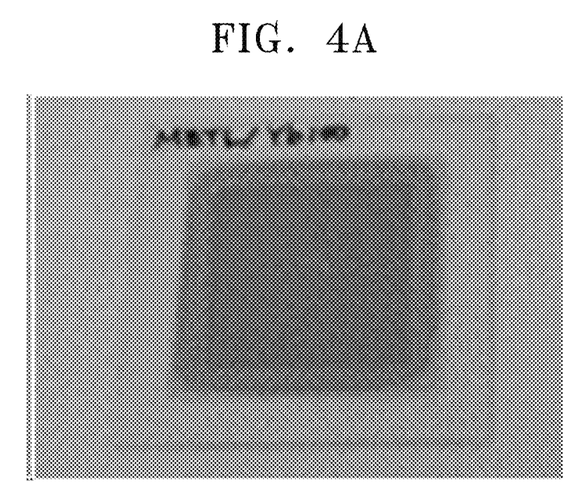
FIGS. 4A and 4B are, respectively, a film image of Test Example 1 and a film image of Test Example 2.
Figure 4B:
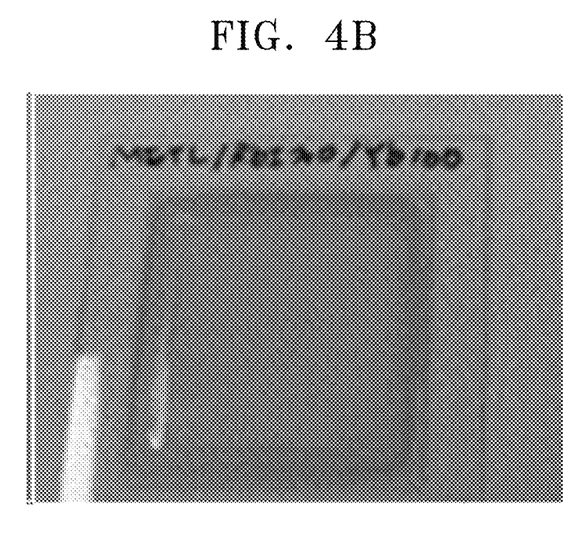

FIG. 4A is an image of the film of Test Example 1, and FIG. 4B is an image of the film of Test Example 2. Referring to FIGS. 4A and 4B, it was shown that the film of Test Example 1 in which a single Yb layer was formed on $Alq_3$ was in an opaque state, whereas the film of Test Example 2 in which a laminated layer of RbI and Yb was formed on $Alq_3$ was in a transparent state. Accordingly, it was confirmed that the reaction between RbI and Yb results in a transparent state.

Electron Injection Characteristics

Example 1

An anode was prepared by ultrasonically cleaning a Corning 15 $\Omega/cm^2$ (1,200 Å) ITO glass substrate by using isopropyl alcohol and pure water for 5 minutes each, and then, irradiating ultraviolet (UV) light for 30 minutes, and exposing to ozone to clean. Then, $Alq_3$ was vacuum deposited on the ITO glass substrate to form a hole blocking layer having a thickness of 1,000 Å. 98 wt % of CBP as a host and 2 wt % of PtOEP as a dopant were disposed on the hole blocking layer to form a red EML having a thickness of 300 Å. $Alq_3$ was vacuum deposited on the red EML to form an electron transport layer having a thickness of 300 Å. RbI and Yb were co-deposited on the electron transport layer at a volume ratio of 1:1 to form an electron injection layer having a thickness of 15 Å. Then, Ag and Mg were co-deposited on the electron injection layer at a volume ratio of 5:1 to form a cathode having a thickness of 90 Å, thereby completing manufacturing of an electron only device (EOD).

Example 2

An EOD was manufactured in the same or substantially the same manner as in Example 1, except that a green EML was formed instead of the red EML by using $Ir(ppy)_3$ (dopant) instead of PtOEP.

Example 3

An EOD was manufactured in the same or substantially the same manner as in Example 1, except that a blue EML was formed instead of the red EML by using DPAVBi (dopant) and ADN (host) instead of PtOEP and CBP, respectively.

Comparative Example 1

An EOD was manufactured in the same or substantially the same manner as in Example 1, except that RbI was vacuum deposited on the electron transport layer to form an electron injection layer having a thickness of 15 Å, rather than RbI and Yb were co-deposited on the electron transport layer to form an electron injection layer having a thickness of 15 Å.

Comparative Example 2

An EOD was manufactured in the same or substantially the same manner as in Example 2, except that RbI was vacuum deposited on the electron transport layer to form an electron injection layer having a thickness of 15 Å, rather than RbI and Yb were co-deposited on the electron transport layer at a volume ratio of 1:1 on the electron transport layer to form an electron injection layer having a thickness of 15 Å.

Comparative Example 3

An EOD was manufactured in the same or substantially the same manner as in Example 3, except that RbI was vacuum deposited on the electron transport layer to form an electron injection layer having a thickness of 15 Å, rather than RbI and Yb were co-deposited on the electron transport layer at a volume ratio of 1:1 on the electron transport layer to form an electron injection layer having a thickness of 15 Å.

Figure 5:
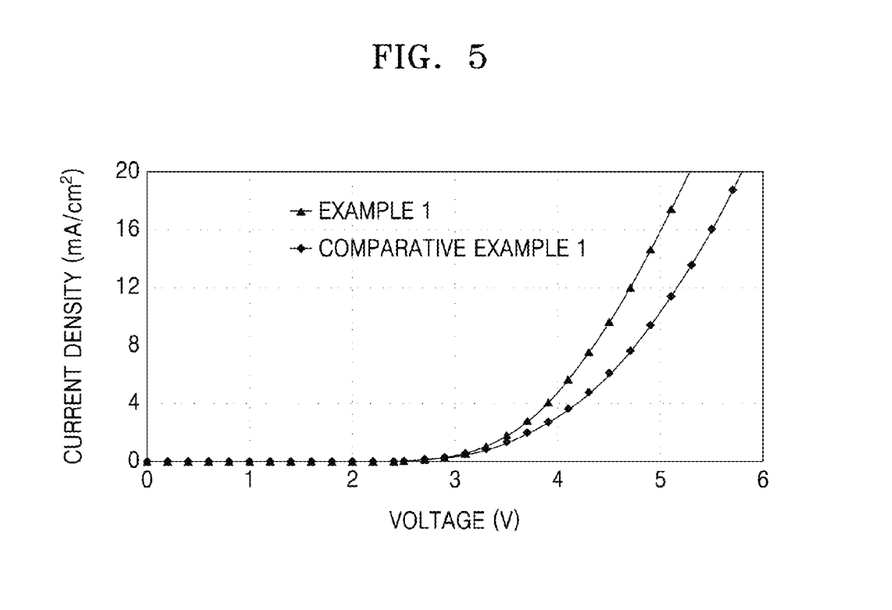
FIG. 5 is a graph showing a relationship between current density and voltage as measured in organic light-emitting devices according to an exemplary embodiment of the present invention and in Comparative Example 1.
Figure 6:
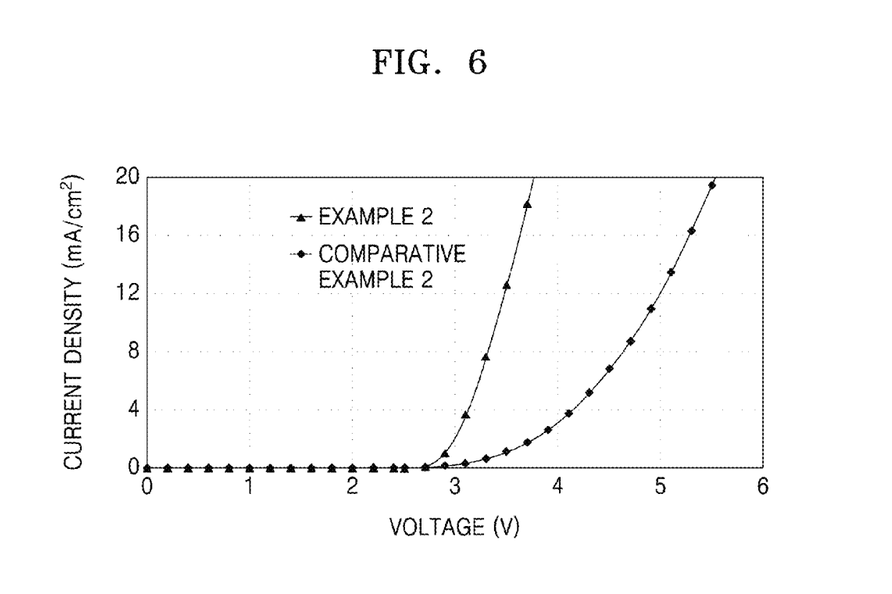
FIG. 6 is a graph showing a relationship between current density and voltage as measured in organic light-emitting devices according to an exemplary embodiment of the present invention and in Comparative Example 2.
Figure 7:
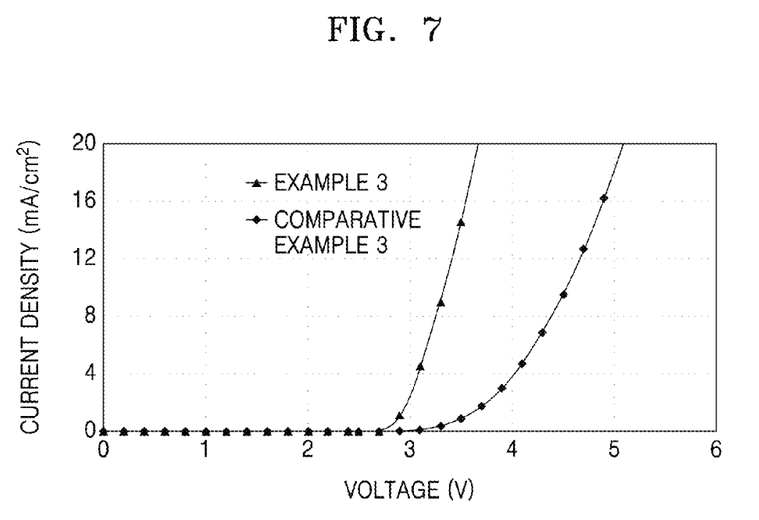
FIG. 7 is a graph showing a relationship between current density and voltage as measured in organic light-emitting devices according to an exemplary embodiment of the present invention and in Comparative Example 3.

FIG. 5 is a graph showing a relationship between current density and voltage as measured in the EODs of Example 1 and Comparative Example 1. FIG. 6 is a graph showing a relationship between current density and voltage as measured in the EODs of Example 2 and Comparative Example 2. FIG. 7 is a graph showing a relationship between current density and voltage as measured in the EODs of Example 3 and Comparative Example 3.

Referring to FIGS. 5 to 7, the current density of the EODs of Examples 1 to 3 was greater than that of the EDOs of Comparative Examples 1 to 3, respectively, at the same or substantially the same voltage. In this regard, it was confirmed that the EODs of Examples 1 to 3 each had greater electron injection efficiency of the electron injection layer than that of the EODs of Comparative Examples 1 to 3.

Device Characteristics

Example 4

An EOD was prepared by ultrasonically cleaning a Corning 15 $\Omega/cm^2$ (1,200 Å) ITO glass substrate by using isopropyl alcohol and pure water for 5 minutes each, and then, irradiating UV light for 30 minutes, and exposing to ozone to clean. Then, 2-TNATA was vacuum deposited on the ITO glass substrate to form a hole blocking layer having a thickness of 600 Å. NPB was vacuum deposited on the hole blocking layer to form a hole transport layer having a thickness of 300 Å. 98 wt % of CBP as a host and 2 wt % of PtOEP as a dopant were disposed on the hole transport layer to form a red EML having a thickness of 300 Å. Alq$_3$ was vacuum deposited on the red EML to form an electron transport layer having a thickness of 300 Å. RbI and Yb were co-deposited on the electron transport layer at a volume ratio of 1:1 to form an electron injection layer having a thickness of 15 Å. Then, Ag and Mg were co-deposited on the electron injection layer at a volume ratio of 5:1 to form a cathode having a thickness of 90 Å, thereby completing manufacturing of an organic light-emitting device.

Example 5

An organic light-emitting device was manufactured in the same or substantially the same manner as in Example 4, except that a green EML was formed instead of the red EML by using Ir(ppy)$_3$ (dopant) instead of PtOEP.

Example 6

An organic light-emitting device was manufactured in the same or substantially the same manner as in Example 4, except that a blue EML was formed instead of the red EML by using DPAVBi (dopant) and ADN (host) instead of PtOEP and CBP, respectively.

Comparative Example 4

An organic light-emitting device was manufactured in the same or substantially the same manner as in Example 4, except that RbI was vacuum deposited on the electron transport layer to form an electron injection layer having a thickness of 15 Å, rather than RbI and Yb being co-deposited on the electron transport layer at a volume ratio of 1:1 on the electron transport layer to form an electron injection layer having a thickness of 15 Å.

Comparative Example 5

An organic light-emitting device was manufactured in the same or substantially the same manner as in Example 5, except that RbI was vacuum deposited on the electron transport layer to form an electron injection layer having a thickness of 15 Å, rather than RbI and Yb being co-deposited on the electron transport layer at a volume ratio of 1:1 on the electron transport layer to form an electron injection layer having a thickness of 15 Å.

Comparative Example 6

An organic light-emitting device was manufactured in the same or substantially the same manner as in Example 6, except that RbI was vacuum deposited on the electron transport layer to form an electron injection layer having a thickness of 15 Å, rather than RbI and Yb being co-deposited on the electron transport layer at a volume ratio of 1:1 on the electron transport layer to form an electron injection layer having a thickness of 15 Å.

The driving voltage and current density measured at the corresponding driving voltage of the organic light-emitting devices of Examples 4 to 6 and Comparative Examples 4 to 6 are shown in Table 1 below.

TABLE 1

| | Emission layer | Electron injection layer | Driving voltage [V] | Current density (mA/cm$^2$) |
|---|---|---|---|---|
| Example 4 | Red | RbI:Yb (15 Å) | 5.0 | 16.7 |
| Comparative Example 4 | Red | RbI (15 Å) | 4.8 | 8.4 |
| Example 5 | Green | RbI:Yb (15 Å) | 4.0 | 28.2 |
| Comparative Example 5 | Green | RbI (15 Å) | 5.1 | 14.0 |
| Example 6 | Blue | RbI:Yb (15 Å) | 3.4 | 12.1 |
| Comparative Example 6 | Blue | RbI (15 Å) | 4.7 | 12.6 |

Referring to Table 1, the organic light-emitting devices of Examples 4 and Example 5 each had the current density that is two or more times higher than that of the organic light-emitting devices of Comparative Examples 4 and 5. The organic light-emitting device of Example 5 had the driving voltage that is lower than that of the organic light-emitting device of Comparative Example 5. In addition, it was confirmed that the organic light-emitting device of Example 6 had the driving voltage that is lower than that of the organic light-emitting device of Comparative Example 6.

As described above, according to the one or more of the above exemplary embodiments, an electron injection layer is prepared by co-depositing a halide of an alkali metal with one of a lanthanide metal and an alkaline earth metal. Alternatively, the electron injection layer is formed of a first layer including a halide of an alkali metal and a second layer including one of a lanthanide metal and an alkaline earth metal. In this regard, the electron injection layer may contribute to lowering driving voltage and increasing efficiency of an organic light-emitting device.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various suitable changes in form and details may be made therein without departing from the spirit and scope as defined by the following claims, and equivalents thereof.

It will be understood that, although the terms "first", "second", "third", etc., may be used herein to describe various elements, components, regions, layers and/or materials, these elements, components, regions, layers and/or materials should not be limited by these terms. These terms are used to distinguish one element, component, region, layer or material from another element, component, region, layer or material. Thus, a first element, component, region, layer or material discussed below could be termed a second element, component, region, layer or material, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

What is claimed is:

1. An organic light-emitting device comprising:
a substrate;
an anode on the substrate;
a hole transport region on the anode;
an emission layer on the hole transport region;
an electron transport region on the emission layer; and
a cathode on the electron transport region,
wherein the electron transport region comprises an electron injection layer comprising: a first material comprising at least one of a halide of an alkali metal (Group 1); and a second material comprising a first lanthanide metal, and
wherein the cathode contacts the electron injection layer and comprises a first metal comprising at least one of silver (Ag), gold (Au), platinum (Pt), copper (Cu), manganese (Mn), titanium (Ti), cobalt (Co), nickel (Ni), and tungsten (W); and a second metal comprising at least one of a second lanthanide metal and an alkaline earth metal, wherein an amount of the first metal is equal to or greater than that of the second metal, and
wherein the first material comprises at least one of lithium chloride (LiCl), sodium chloride (NaCl), potassium chloride (KCl), rubidium chloride (RbCl), cesium chloride (CsCl), potassium bromide (KBr), rubidium bromide (RbBr), cesium bromide (CsBr), potassium iodide (KI), rubidium iodide (RbI), and cesium iodide (CsI).

2. The organic light-emitting device of claim 1, wherein at least one of the first lanthanide metal and the second lanthanide metal is at least one selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), and
wherein the alkaline earth metal is at least one selected from the group consisting of beryllium (Be), magnesium (Mg), calcium (Ca), strontium (Sr), barium (Ba), and radium (Ra).

3. The organic light-emitting device of claim 1, wherein a thickness of the electron injection layer is in a range of 1 Å to 50 Å.

4. The organic light-emitting device of claim 1, wherein the first material and the second material are co-deposited to form the electron injection layer.

5. The organic light-emitting device of claim 4, wherein a volume ratio of the first material to the second material is in a range of 1:9 to 9:1.

6. The organic light-emitting device of claim 4, wherein the first material comprises at least one of RbI and RbCl; and the second material comprises at least one of Yb and Mg.

7. The organic light-emitting device of claim 1, wherein the electron injection layer comprises a first layer formed of the first material, and a second layer formed of the second material.

8. The organic light-emitting device of claim 7, wherein the first material comprises at least one of RbI and RbCl, and the second material comprises at least one of Yb and Mg.

9. The organic light-emitting device of claim 1, wherein the electron injection layer comprises a first layer formed of the second material, and a second layer formed of the first material.

10. The organic light-emitting device of claim 9, wherein the first material comprises at least one of RbI and RbCl, and the second material comprises at least one of Yb and Mg.

11. The organic light-emitting device of claim 7, wherein each of thicknesses of the first layer and the second layer is in a range of 1 Å to 49 Å, and a sum of the thicknesses is in a range of 1 Å to 50 Å.

12. The organic light-emitting device of claim 1, wherein a volume ratio of the first metal to the second metal is in a range of 50:50 to 99:1.

13. The organic light-emitting device of claim 1, wherein the cathode is formed of Ag:Mg or Ag:Yb.

14. The organic light-emitting device of claim 1, wherein the electron transport region further comprises an electron transport layer between the electron injection layer and the emission layer.

15. The organic light-emitting device of claim 14, wherein the electron transport layer comprises at least one of $Alq_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate ($Bebq_2$), and 9,10-di(naphthalene-2-yl)anthrascene (ADN).

16. The organic light-emitting device of claim 14, wherein the electron transport layer further comprises a lithium (Li) complex.

17. The organic light-emitting device of claim 14, wherein the electron transport region further comprises a hole blocking layer between the electron transport layer and the emission layer.

18. The organic light-emitting device of claim 1, wherein the hole transport region comprises at least one of a hole injection layer, a hole transport layer, and an electron blocking layer.

* * * * *